(12) United States Patent
Chung et al.

(10) Patent No.: US 9,755,104 B2
(45) Date of Patent: Sep. 5, 2017

(54) METHOD OF MANUFACTURING OPTOELECTRONIC ELEMENT HAVING ROUGH SURFACE

(71) Applicant: EPISTAR CORPORATION, Hsinchu (TW)

(72) Inventors: Wei Jung Chung, Hsinchu (TW); Chi Hao Huang, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 90 days.

(21) Appl. No.: 14/274,358

(22) Filed: May 9, 2014

(65) Prior Publication Data

US 2015/0325744 A1    Nov. 12, 2015

(51) Int. Cl.
*H01L 21/311*    (2006.01)
*H01L 33/00*    (2010.01)
*H01L 33/22*    (2010.01)
*H01L 33/38*    (2010.01)

(52) U.S. Cl.
CPC ...... *H01L 33/0095* (2013.01); *H01L 33/0062* (2013.01); *H01L 33/0066* (2013.01); *H01L 33/22* (2013.01); *H01L 33/38* (2013.01); *H01L 2221/1094* (2013.01); *H01L 2933/0033* (2013.01); *H01L 2933/0058* (2013.01)

(58) Field of Classification Search
CPC ......... H01L 2221/1094; H01L 27/1292; H01L 21/02639; B05D 5/083
See application file for complete search history.

(56) References Cited

U.S. PATENT DOCUMENTS

| | | | | |
|---|---|---|---|---|
| 6,130,143 A | * | 10/2000 | Westwater | ........ H01L 21/02639 257/E21.09 |
| 7,244,679 B2 | * | 7/2007 | Koh | ....................... B82Y 10/00 257/E21.209 |
| 7,649,192 B2 | * | 1/2010 | Choi | ...................... B82Y 30/00 257/10 |
| 8,540,889 B1 | * | 9/2013 | Hartlove | ................ B05D 5/083 216/11 |
| 2002/0125824 A1 | * | 9/2002 | Fukuzawa | ............. C23C 14/042 313/640 |
| 2006/0147800 A1 | * | 7/2006 | Sato | ...................... H01M 4/134 429/231.95 |
| 2008/0268288 A1 | * | 10/2008 | Jin | ....................... B81C 1/00031 428/800 |
| 2010/0090230 A1 | * | 4/2010 | Honma | .................. B82Y 20/00 257/89 |

* cited by examiner

*Primary Examiner* — Zandra Smith
*Assistant Examiner* — John M Parker
(74) *Attorney, Agent, or Firm* — Muncy, Geissler, Olds & Lowe, P.C.

(57) ABSTRACT

A method of forming a rough surface includes: providing an article having a top surface, forming a plurality of agglomerated grains on the top surface by a deposition process, and patterning the top surface to form a rough surface by using the plurality of agglomerated grains as a mask.

19 Claims, 5 Drawing Sheets

METHOD OF MANUFACTURING OPTOELECTRONIC ELEMENT HAVING ROUGH SURFACE

TECHNICAL FIELD

The application relates to a method of manufacturing an optoelectronic element having a rough surface, particularly relates to forming a rough surface on the optoelectronic element by using a plurality of agglomerated grains as a mask.

DESCRIPTION OF BACKGROUND ART

An article having a rough surface provides many different properties. More of all, to improve some optical properties of the article, roughening surface of an article is one of the useful methods. For example, roughened or textured surface of light-emitting device is helpful to increase light extraction efficiency.

Currently, one of the methods for roughening semiconductor surface includes the steps of coating a photoresist layer on the surface of the semiconductor, using a mask to align and expose a predetermined area of the photoresist layer, curing or degrading the exposed portion, removing a predetermined portion of the photoresist layer, etching the uncover photoresist layer portion of the semiconductor, and removing the remained portion of the photoresist layer. In this method of roughening semiconductor surface, the manufacturing process is complicated and the cost is also high because the equipment for the alignment process is expensive. In addition, the mask needs to be customized for the various dimensions and patterns of the rough surface.

Another method for forming a rough surface on an optoelectronic element is directly etching the surface of the element without using a mask. For example, the etchant of wet etching has different etching rate depending on which crystalline plane of a crystallized material is etched. However, it is difficult to control the surface morphology.

In addition, the light-emitting device can be further connected to other components in order to form a light emitting apparatus. The light-emitting device may be mounted onto a submount with the side of the substrate, or a solder bump or a glue material may be formed between the submount and the nitride-based light-emitting device, therefore a light-emitting apparatus is formed. Besides, the submount further comprises the circuit layout electrically connected to the electrode of the light-emitting device via an electrical conductive structure such as a metal wire.

SUMMARY OF THE DISCLOSURE

The present disclosure a method of manufacturing a rough surface, including: providing an article comprising a top surface, forming a plurality of agglomerated grains on the top surface by a deposition process, and patterning the top surface to form a rough surface by using the plurality of agglomerated grains as a mask.

DETAILED DESCRIPTION OF PREFERRED EMBODIMENTS

Figure 1A:
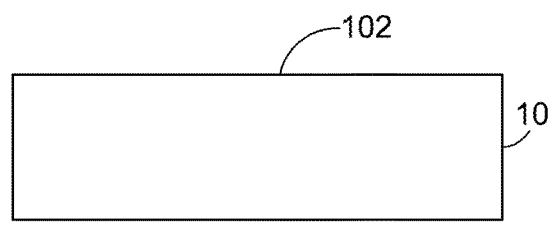
FIGS. 1A to 1E show a method of forming a rough surface on an optoelectronic element in accordance with a first embodiment of the present application.
Figure 1B:
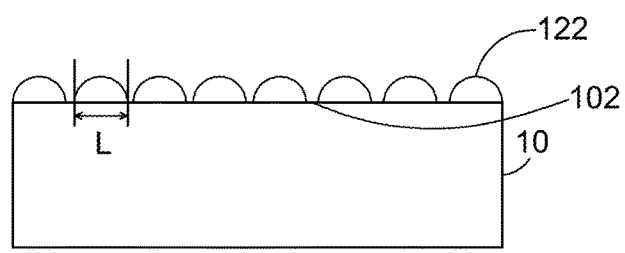

Referring to FIGS. 1A to 1E, a method of forming a rough surface of an article is disclosed in accordance with a first embodiment of the present application. As shown in FIG. 1A, the article 10 including a top surface 102 is provided. In the present embodiment, the article 10 is an optoelectronic element. The optoelectronic element may be a solar cell device or a light-emitting device. The light-emitting device may include a light-emitting body and a growth substrate. For example, the light-emitting body has a stack of layers, including a first semiconductor layer, an active layer, and a second semiconductor layer. The material of the first semiconductor layer, the active layer, and the second semiconductor layer may be III-V compound, such as $Al_xIn_yGa_{(1-x-y)}N$ or $Al_xIn_yGa_{(1-x-y)}P$, $0 \leq x$, $y \leq 1$; $(x+y) \leq 1$. The growth substrate maybe a single layer or a stack. The material of the single layer can be sapphire, Si or glass, and in this case, a single-crystalline Si wafer is provided. The light-emitting device may include the growth substrate, the light-emitting body, and an electrode formed on the light-emitting body.

Figure 1C:
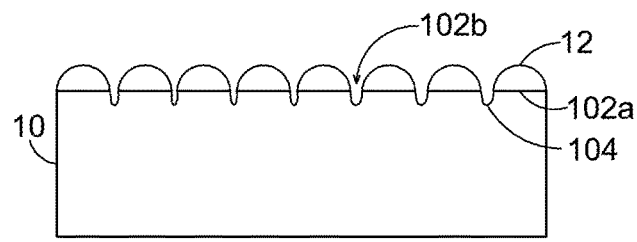
Figure 1D:
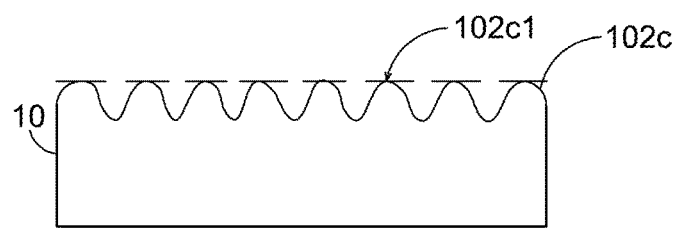
Figure 1E:
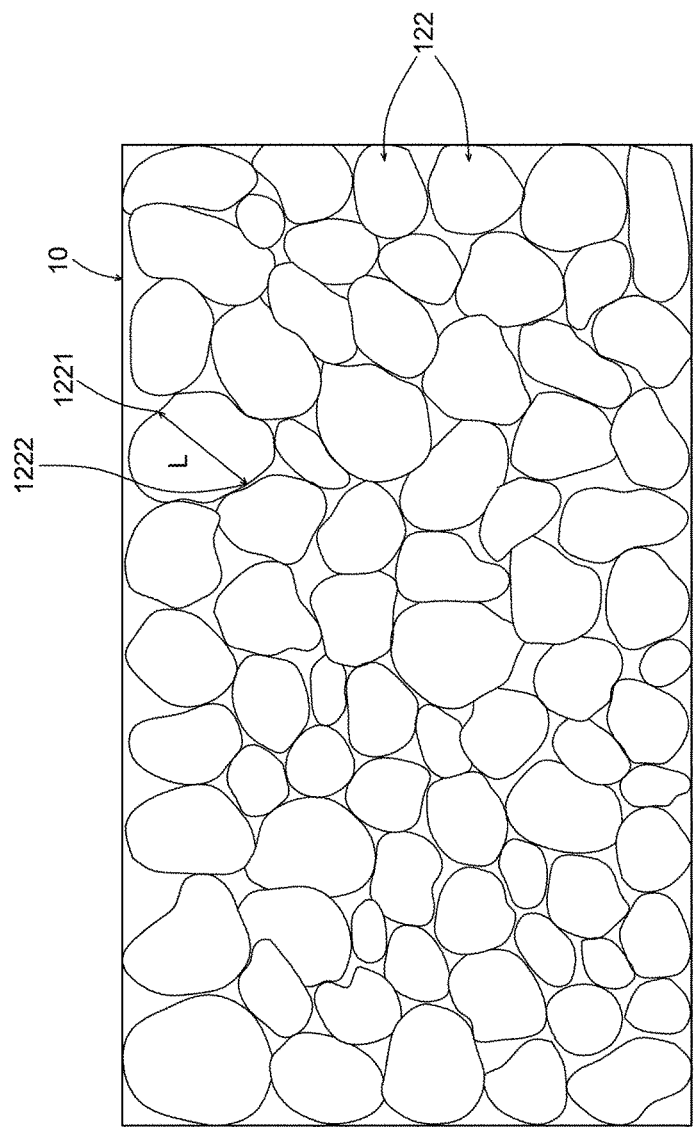

As shown in FIGS. 1B to 1E, a plurality of agglomerated grains 122 is formed on the top surface of the article by a deposition process, wherein FIG. 1E is a top view of the top surface of the article. During the initial stage of the deposition process, the material is formed as a plurality of seeds (not shown) on the top surface 102 of the article. As the deposition performs, the seeds grow while some seeds may be agglomerated with others. The seeds deposited on the top surface 102 of the article gradually form the plurality of agglomerated grains 122. The plurality of agglomerated grains 122 is substantially close to but disconnected from each other. Furthermore, the larger the density of the plurality of agglomerated grains 122 is, the better the result of the rough surface of the article is. The plurality of agglomerated grains 122 can be an irregular pattern as shown in FIG. 1E. In the present embodiment, any one of the agglomerated grains 122 has a feature length L, which can be from 500 angstrom to 50000 angstrom, 1000 angstrom to 40000 angstrom, or 2000 angstrom to 30000 angstrom, wherein the feature length is defined as the largest distance between any two points, for example, a first point 1221 and a second point 1222, on the grain boundary. The material of the agglomerated grain includes metal, and in the present embodiment, the metal material has a melting point lower than 350° C., such as In, Sn, Bi, and Pb. The deposition process includes evaporation process, sputtering process, and the like. Usually, if the temperature of deposition process is high, it may impose limitation on the manufacturing process of the article because, for example, a higher deposition temperature such as above 500° C. may damage the ohmic contact of Indium Tin Oxide (ITO). If the deposition temperature is lower as the present embodiment indicates, the flexibility of the manufacturing process of the article can be improved. In the present embodiment, the temperature of the deposition process is lower than the melting point of the material of the agglomerated grain. There is no need of additional thermal process in the deposition process of the growth duration of the plurality of the agglomerated grains 122. In this case, the temperature of the deposition process is lower than 100° C. In other case, the plurality of the agglomerated grains 122 can be formed when the temperature of the deposition process is below 500° C. Furthermore, in the present exemplary embodiment, there is no additional thermal process after the deposition process and before patterning the top surface of the article.

Referring to FIGS. 1C and 1D, the top surface of the article is patterned to form a rough surface 102c by the etching process using the plurality of agglomerated grains 122 as a mask 12. The mask 12 provides a covered portion 102a of the top surface 102 of the article and an uncovered portion 102b that exposes the top surface 102 of the article. The etching process gradually forms a rough surface on the top surface 102 of the article 10. A plurality of recesses 104 can be formed below the uncovered portion 102b by the etching process. In the present embodiment, each of the agglomerated grains does not have a fixed thickness and usually has thinner thickness near the boundary which is not thick enough to resist the attack of etching process so the recess can also be formed under the boundary. In addition, the etching process includes dry etching, e.g., ICP etching, and wet etching. The etchant includes $CF_4$.

The remaining of the agglomerated grains (not shown) can be further removed from the rough surface 102c of the article. In this case, the rough surface 102c of the article has a plurality of protrusions 102c1 unevenly spreads over the rough surface thereof. The plurality of protrusions 102c1 can be an irregular pattern. The shape of the protrusion 102c1 may include a hexagonal cone, a round cone and a mixture. In the present embodiment, the shape of the protrusion 102c1 is hexagonal cone and its two sides have different lengths.

In the present embodiment, the mask is formed directly on the article during the growth of the plurality of the agglomerated grains and may not need the equipment of alignment to define the pattern. Therefore, the cost of forming a rough surface is less, and the process of forming a rough surface is simpler.

Figure 2A:
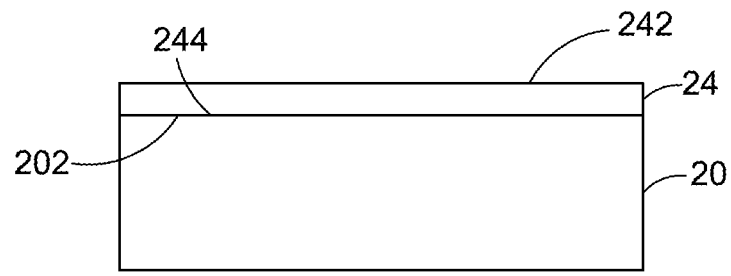
FIGS. 2A to 2E show a method of forming a rough surface on an optoelectronic element in accordance with a second embodiment of the present application.

Referring to FIGS. 2A to 2D, a method of forming a rough surface of the article is disclosed in accordance with a second embodiment of the present application. As shown in FIG. 2A, the article 20 including a top surface 202 is covered by a protective layer 24. The protective layer 24 has an outer surface 242 and an inner surface 244 covering and contacting with the top surface 202 to form an interface. The material of the protective layer 24 includes Si, $Al_2O_3$, $SiO_2$, $TiO_2$, $SiN_x$, and $SiO_xN_y$. The protective layer 24 may provide a preferred layer to grow the plurality of the agglomerated grains in later process. The protective layer 24 may also protect the article 20 to decrease the damage in later etching process. The method of forming the protective layer 24 on the article 20 includes the chemical vapor deposition process (CVD), the evaporation process, the sputtering process, and the like.

Figure 2B:
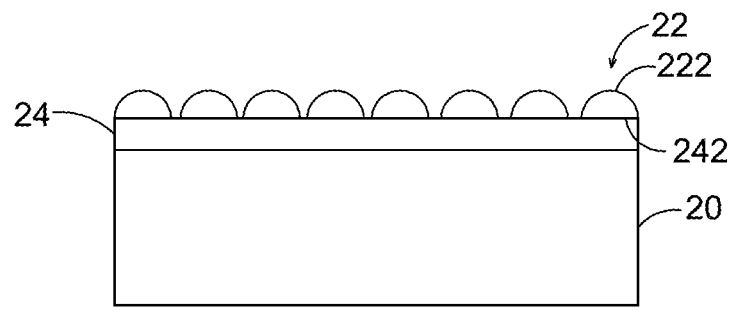

As shown in FIG. 2B, a plurality of agglomerated grains 222 can be formed on the top surface 202 by a deposition process. In the present embodiment, unlike the embodiment illustrated in FIG. 1B, the plurality of agglomerated grains 222 is formed directly on the outer surface 242 of the protective layer 24.

Figure 2C:
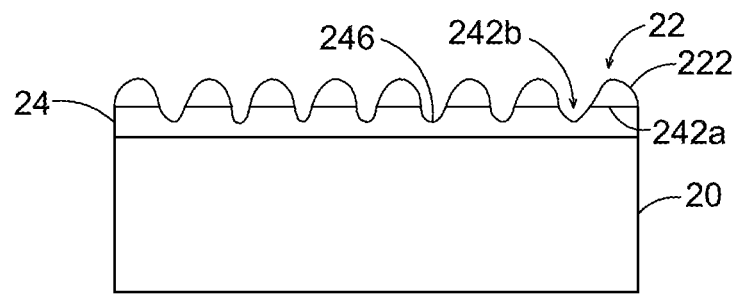
Figure 2D:
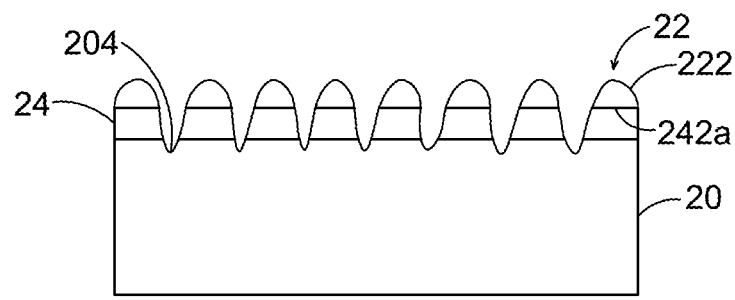
Figure 2E:
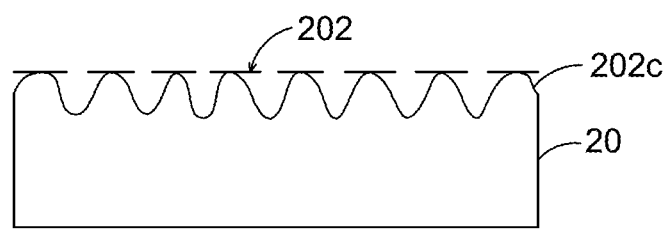

Referring to FIGS. 2C to 2E, the top surface of the article is patterned to form a rough surface 202c with the plurality of agglomerated grains 222 as a mask 22 by etching process. The mask 22 provides a covered portion 242a and an uncovered portion 242b of the outer surface 242, wherein the plurality of agglomerated grains 222 stands on the cover portion 242. A plurality of recesses 246 corresponding to the uncover portion 242b is formed in the beginning of the etching process, penetrates the protective layer 24 as etching process performs, and a plurality of recesses 204 corresponding to the plurality of recesses 246 is finally formed below the interface between the protective layer 24 and the article 20.

The remaining of the agglomerated grains (not shown) can be further removed from the rough surface 202c of the article. In the present embodiment, removing the remained agglomerated grains and the remained protective layer 24 can completely expose the top surface 202 of the article 20.

Figure 3:
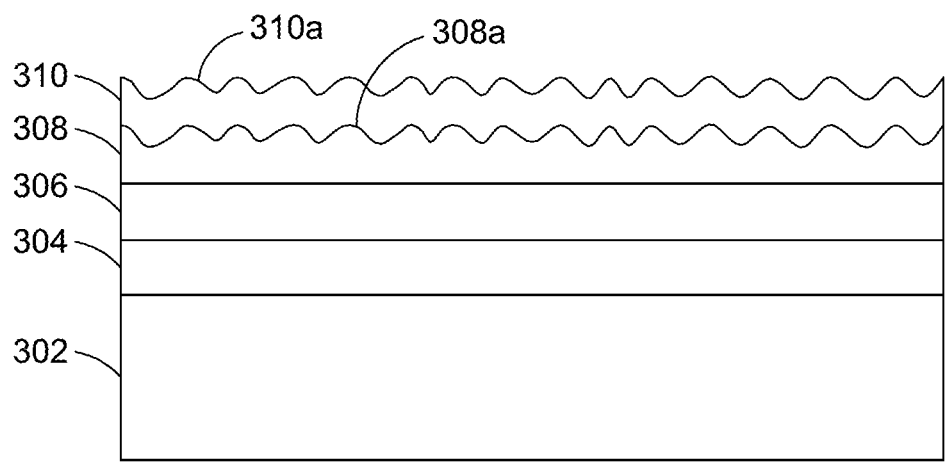
FIG. 3 shows a light-emitting device in accordance with a second embodiment of the present application.

As shown in FIG. 3, a light-emitting device in accordance with the second embodiment of the present application is disclosed. A light-emitting device 300 includes: a growth substrate 302, a first semiconductor layer 304 formed on the growth substrate 302, an active layer 306 formed on the first semiconductor layer 304, a second semiconductor layer 308 formed on the active layer 306. In this embodiment, the second semiconductor layer 308 has an irregularly uneven surface 308a formed by the abovementioned method. A transparent conductive layer 310 can be formed on the irregularly uneven surface 308a so as to form an irregularly uneven surface 310a. Alternatively, the abovementioned method is not applied to the second semiconductor layer 308 but is applied to the transparent conductive layer 310 after it is formed on the second semiconductor layer 308 so the irregularly uneven surface 310a of the transparent conductive layer 310 can be formed. The irregularly uneven surface of the transparent conductive layer 310 can increase light extraction efficiency as light is emitted from the active layer 306 through the surface of the transparent conductive layer 310. In the present embodiment, the first semiconductor layer 304 can be an n-type semiconductor layer and the second semiconductor layer 308 can be a p-type semiconductor layer. The material of the transparent conductive layer 310 can be Indium Tin Oxide (ITO), fluorine doped tin oxide (FTO), or doped zinc oxide.

Although the present application has been explained above, it is not the limitation of the range, the sequence in practice, the material in practice, or the method in practice. Any modification or decoration for present application is not detached from the spirit and the range of such.

What is claimed is:

1. A method of forming a rough surface of an article, comprising:
   providing the article comprising a top surface;
   forming a plurality of seeds comprising a metal material on the top surface during an initial stage of evaporation or sputtering process;
   agglomerating the plurality of seeds into a plurality of agglomerated grains on the top surface after the initial stage of evaporation or sputtering process; and
   patterning the top surface to form the rough surface of the article by using the plurality of agglomerated grains as a mask,
   wherein the plurality of agglomerated grains are non-uniform in size, and
   wherein one of the plurality of seeds is different in size from one of the agglomerated grains.

2. The method of claim 1, wherein the plurality of agglomerated grains is substantially disconnected from each other, wherein the plurality of agglomerated grains only has the metal material.

3. The method of claim 2, wherein the metal material has a melting point lower than 350° C.

4. The method of claim 1, wherein there is no additional thermal process to agglomerate the plurality of seeds after the evaporation or the sputtering process and before patterning the top surface of the article.

5. The method of claim 1, wherein the metal material comprises In, Sn, Bi, or Pb.

6. The method of claim 1, wherein the metal material has a melting point and the evaporation or the sputtering process is controlled at a process temperature lower than the melting point.

7. The method of claim 6, wherein the process temperature is lower than 100° C.

8. The method of claim 1, wherein the rough surface comprises a plurality of hexagonal protrusions unevenly spread over the rough surface of the article.

9. The method of claim 8, wherein two sides of one of the plurality of the hexagonal protrusion have different length.

10. The method of claim 1, further comprising forming a protective layer on the top surface of the article before forming the plurality of agglomerated grains.

11. The method of claim 10, further comprising etching the plurality of agglomerated grains, the protective layer, and the top surface after forming the plurality of agglomerated grains.

12. The method of claim 11, wherein the etching method comprises using an etchant comprising $CF_4$.

13. The method of claim 10, wherein the protective layer comprises a material elected from a group consisting of $Al_2O_3$, $SiO_2$, $TiO_2$, SiNx, and SiOxNy.

14. The method of claim 1, wherein the article comprises III-V compound, IV element, IV compound, sapphire, or silicon.

15. The method of claim 1, wherein one of the plurality of agglomerated grains has a feature length between 500 angstrom and 50000 angstrom.

16. A method of forming a rough surface of an article, comprising:
    providing the article comprising a top surface;
    forming a plurality of seeds comprising a metal material on the top surface during an initial stage of evaporation or sputtering process;
    agglomerating the plurality of seeds into a plurality of agglomerated grains on the top surface after the initial stage of evaporation or sputtering process; and
    patterning the top surface to form the rough surface of the article by using the plurality of agglomerated grains as a mask,
    wherein the metal material has a melting point lower than 350° C., and the evaporation or the sputtering process is controlled at a process temperature lower than the melting point.

17. The method of claim 16, wherein the plurality of agglomerated grains are non-uniform in size.

18. A method of forming a rough surface of an article, comprising:
    providing the article comprising a top surface;
    forming a plurality of seeds comprising a metal material on the top surface during an initial stage of evaporation or sputtering process;
    agglomerating the plurality of seeds into a plurality of agglomerated grains on the top surface after the initial stage of evaporation or sputtering process; and
    patterning the top surface to form the rough surface of the article by using the plurality of agglomerated grains as a mask,
    wherein the plurality of agglomerated grains comprises an irregular pattern.

19. The method of claim 18, wherein one of the plurality of seeds is different in size from one of the agglomerated grains.

* * * * *